United States Patent
Kakiuchi

(10) Patent No.: US 7,764,119 B2
(45) Date of Patent: Jul. 27, 2010

(54) VOLTAGE CONTROL CIRCUIT

(75) Inventor: Takashi Kakiuchi, Shinagawa (JP)

(73) Assignee: Fujitsu Semiconductor Limited, Yokohama (JP)

( * ) Notice: Subject to any disclaimer, the term of this patent is extended or adjusted under 35 U.S.C. 154(b) by 118 days.

(21) Appl. No.: 12/039,478

(22) Filed: Feb. 28, 2008

(65) Prior Publication Data

US 2008/0211477 A1    Sep. 4, 2008

(30) Foreign Application Priority Data

Mar. 1, 2007    (JP) .............................. 2007-051965

(51) Int. Cl.
*H03F 1/14* (2006.01)

(52) U.S. Cl. ...................................... 330/51

(58) Field of Classification Search ..................... 330/9, 330/51; 323/318
See application file for complete search history.

(56) References Cited

U.S. PATENT DOCUMENTS 6,940,345 B2 *    9/2005    Nair et al. ..................... 330/51

FOREIGN PATENT DOCUMENTS

| CN | 1030155 A | 1/1989 |
|---|---|---|
| JP | 53-087156 | 8/1978 |
| JP | 55-077216 A | 6/1980 |
| JP | 2004-015154 A | 1/2004 |
| JP | 2005-110448 A | 4/2005 |
| JP | 2006-217106 A | 8/2006 |

\* cited by examiner

*Primary Examiner*—Khanh V Nguyen
(74) *Attorney, Agent, or Firm*—Arent Fox LLP

(57) ABSTRACT

A circuit for controlling voltage includes a condenser having a first end coupled to an input node of a target circuit, and a second end coupled to a predetermined fixed potential, a constant current source coupled to the first end of the condenser, and a control circuit configured to charge or discharge the condenser by the constant current source, to measure a first time period passing from start timing of the charge or discharge to timing at which a voltage at the first end of the condenser reaches a predetermined voltage, and to change an input condition or operation condition of the target circuit upon passage of a second time period from the start timing where the second time period is responsive to the first time period.

9 Claims, 11 Drawing Sheets

VOLTAGE CONTROL CIRCUIT

CROSS-REFERENCE TO RELATED APPLICATIONS

The present application is based upon and claims the benefit of priority from the prior Japanese Patent Application No. 2007-051965 filed on Mar. 1, 2007, with the Japanese Patent Office, the entire contents of which are incorporated herein by reference.

BACKGROUND OF THE INVENTION

1. Field of the Invention

The disclosures herein generally relate to voltage control circuits, and particularly relate to a voltage control circuit that controls voltage by charging and discharging a condenser.

2. Description of the Related Art

For the purpose of suppressing an unpleasant sound (referred to as pop sound or crackle sound) occurring upon power-on/off of an audio amplifier, it is sometimes necessary to provide a genteel voltage change at the input of the amplifier while avoiding a sudden voltage change. To this end, charging/discharging is performed with respect to a condenser, and the voltage appearing at the ends of the condenser is often used as a voltage source. Alternatively, the voltage appearing at the ends of the condenser is amplified by an amplifier for use as a voltage source.

FIG. 1 is a drawing showing an example of the configuration of a related-art pop-sound suppressing circuit utilizing the charging/discharging of a condenser. A pop-sound suppressing circuit 10 shown in FIG. 1 includes an amplifier 11, a speaker 12, a condenser 13 having capacitance C1, a condenser 14 having capacitance C2, a resistor 15 having resistance R1, a resistor 16 having resistance R2, a resistor 17 having resistance R3, a switch 18, a switch 19, a constant voltage source 20 for providing a signal ground SG, an audio signal source 21, a control circuit 22, and an oscillating circuit 23.

FIG. 2 is a drawing showing signal waveforms illustrating the operation of the pop-sound suppressing circuit 10 shown in FIG. 1. The signals having waveforms illustrated in FIG. 2 are identified in FIG. 1 by their signal names to indicate which signals in the circuit of FIG. 1 correspond to the signals shown in FIG. 2. In the following, a description will be given of the operation of the pop-sound suppressing circuit 10 of FIG. 1 by referring to FIG. 2.

A clock signal CK supplied from the oscillating circuit 23 to the control circuit 22 is active at all times during the period shown in FIG. 2, i.e., is alternating between HIGH and LOW (although not so illustrated in FIG. 2). For the sake of convenience of illustration, two straight lines on the row for the clock signal CK are intended to indicate such an active state in FIG. 2.

The control circuit 22 enables an activation signal PDA of the amplifier 11 at timing t0. In the example shown in FIG. 2, the activation signal PDA is HIGH in the enabled state, so that the amplifier 11 operates during the period in which the activation signal PDA is HIGH. At this timing, a switch control signal S1 generated by the control circuit 22 is LOW, so that the switch 18 is connected to the constant voltage source 20 (i.e., placed in the switching state as illustrated in FIG. 1). At this timing, also, a switch control signal S2 generated by the control circuit 22 is LOW, so that the switch 19 is connected to the ground (i.e., placed in the switching state as illustrated in FIG. 1).

At timing t0, thus, voltage signals V1 and V2 are zero. No electric charge is stored in the condenser 14, so that the non-inverted input (+) of the amplifier 11 is set to the ground potential. The inverted input (−) of the amplifier 11 is set to the signal ground SG that is a reference potential for audio signals. Further, a voltage signal V3 output from the amplifier 11 and a voltage signal V4 input into the speaker 12 are both set to the ground potential. In general, the signal ground potential SG is approximately ½ of the power supply voltage.

At next timing t1, the control circuit 22 changes the control signal S2 for the switch 19 to HIGH, thereby connecting the switch 19 to the potential SG of the constant voltage source 20. As a result, the voltage signal V1 is set to SG to start charging the condenser 14, resulting in a gradual increase in the voltage signal V2. In the end, the voltage signal V2 reaches the voltage SG at timing t3.

With resistance R1 of the resistor 15 equal to resistance R2 of the resistor 16, the amplification factor is 2 with respect to the non-inverted input of the amplifier 11. Accordingly, the output V3 of the amplifier 11 is equal to the ground potential until the non-inverted input V2 reaches ½ of SG at timing t2, and then gradually increases after t2. In the end, the output V3 reaches the voltage SG at timing t3 in the same manner as V2.

Here, the following representation is used.

$$V2 = SG[1 - e^{-t/(R3 \cdot C2)}]$$

Since timing t2 is the timing at which the non-inverted input V2 becomes ½ of SG, t2-t1 is nearly equal to R3×C2×0.69. Based on the assumption that timing t3 is the timing at which the potential of the non-inverted input V2 becomes 99.9% of SG, t3-t1 is nearly equal to R3×C2×6.9.

The input terminal of the speaker 12 receives a flow of an electric current for charging the condenser 13 while the amplifier output voltage V3 is increasing. As a result, the voltage V4 at the input terminal of the speaker 12 increases. This potential increase is genteel as shown in FIG. 2, so that the sound generated by the speaker 12 is outside the audible frequency band, and is not perceived as an unpleasant noise.

After the output V3 of the amplifier 11 reaches SG in this manner, the control circuit 22 changes the switch control signal S1 to HIGH at timing t4. This results in the switch 18 being connected to the audio signal source 21, so that the audio signals are supplied to the inverted input of the amplifier 11. The speaker 12 thus generates sounds responsive to the audio signals.

At the time of switching off the circuit, the control circuit 22 changes the control signal S1 to LOW at timing t5, thereby changing the connection of the switch 18 from connection to the audio signal source 21 to connection to the signal ground SG of the constant voltage source 20. At next timing t6, the control circuit 22 changes the control signal S2 to LOW, thereby changing the connection of the switch 19 from connection to the signal ground SG to connection to the ground. As a result, the voltage signal V1 is set to the ground, and the potential V2 is set to $$V2 = SG \cdot e^{-t/(R3 \cdot C2)}.$$

The electric charge accumulated in the condenser 14 is thus discharged according to the time constant defined by R3 and C2. At timing t8, the potential V2 reaches the ground potential. Timing t7 shown in FIG. 2 indicates the timing at which the potential V2 serving as the non-inverted input of the amplifier 11 is set to ½ of SG. In the same manner as above, t7-t6 is nearly equal to R3×C2×0.69, and t8-t6 is nearly equal to R3×C2×6.9.

The input terminal of the speaker 12 provides a flow of an electric current for discharging the condenser 13, which is opposite to what happened at the time of power-on. As a result, the voltage V4 at the input terminal of the speaker 12 drops. This potential drop is genteel as shown in FIG. 2, so that the sound generated by the speaker 12 is outside the audible frequency band, and is not perceived as an unpleasant noise. Thereafter, the control circuit 22 disables the activation signal PDA at timing t9, thereby stopping the operation of the amplifier 11.

In the operations described above, the time constant may fluctuate due to the variation of resistance R3 of the resistor 17 and capacitance C2 of the condenser 14. In order for the circuit to properly operate even when the time constant becomes the maximum due to the fluctuation, the control operation of the control circuit 22 needs to be designed such as to ensure that timing t4 is always later than timing t3 and timing t9 is always later than timing t7.

As can be seen from FIG. 2, the activation time t3-t2 of the amplifier 11 is shorter than the deactivation time t7-t6 when activation and deactivation are performed according to the time constant defined by R3 and C2. Based on the assumption that the deactivation time is 100 ms, t4-t3=t3-t1, and t9-t8=t8-t6, the amplifier activation time, the amplifier deactivation time, the activation control time, and the deactivation control time are calculated as follows:

Amplifier Activation Time T3−T2=897 ms;
Amplifier Deactivation Time T7−T6=100 ms;
Activation Control Time T4−T1=1993 ms; and
Deactivation Control Time T9−T6=1993 ms.

When such resistance-and-condenser-based charging/discharging is used for the control purpose, it takes a lengthy time to completely charge/discharge the condenser. Because of this, the entirety of the activation and deactivation control time becomes extremely long relative to the amplifier activation time and deactivation time. Consequently, the problem arises that the activation and deactivation of the apparatus become slow, and also that power consumption increases.

Accordingly, there is a need for a voltage control circuit that uses a condenser to rapidly activate and deactivate a target circuit such as an amplifier.

[Patent Document 1] Japanese Patent Application Publication No. 53-87156

[Patent Document 2] Japanese Patent Application Publication No. 2004-15154

SUMMARY OF THE INVENTION

According to an aspect of an embodiment, a circuit for controlling voltage includes a condenser having a first end coupled to an input node of a target circuit, and a second end coupled to a predetermined fixed potential, a constant current source coupled to the first end of the condenser, and a control circuit configured to charge or discharge the condenser by the constant current source, to measure a first time period passing from start timing of the charge or discharge to timing at which a voltage at the first end of the condenser reaches a predetermined voltage, and to change an input condition or operation condition of the target circuit upon passage of a second time period from the start timing where the second time period is responsive to the first time period.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 3:
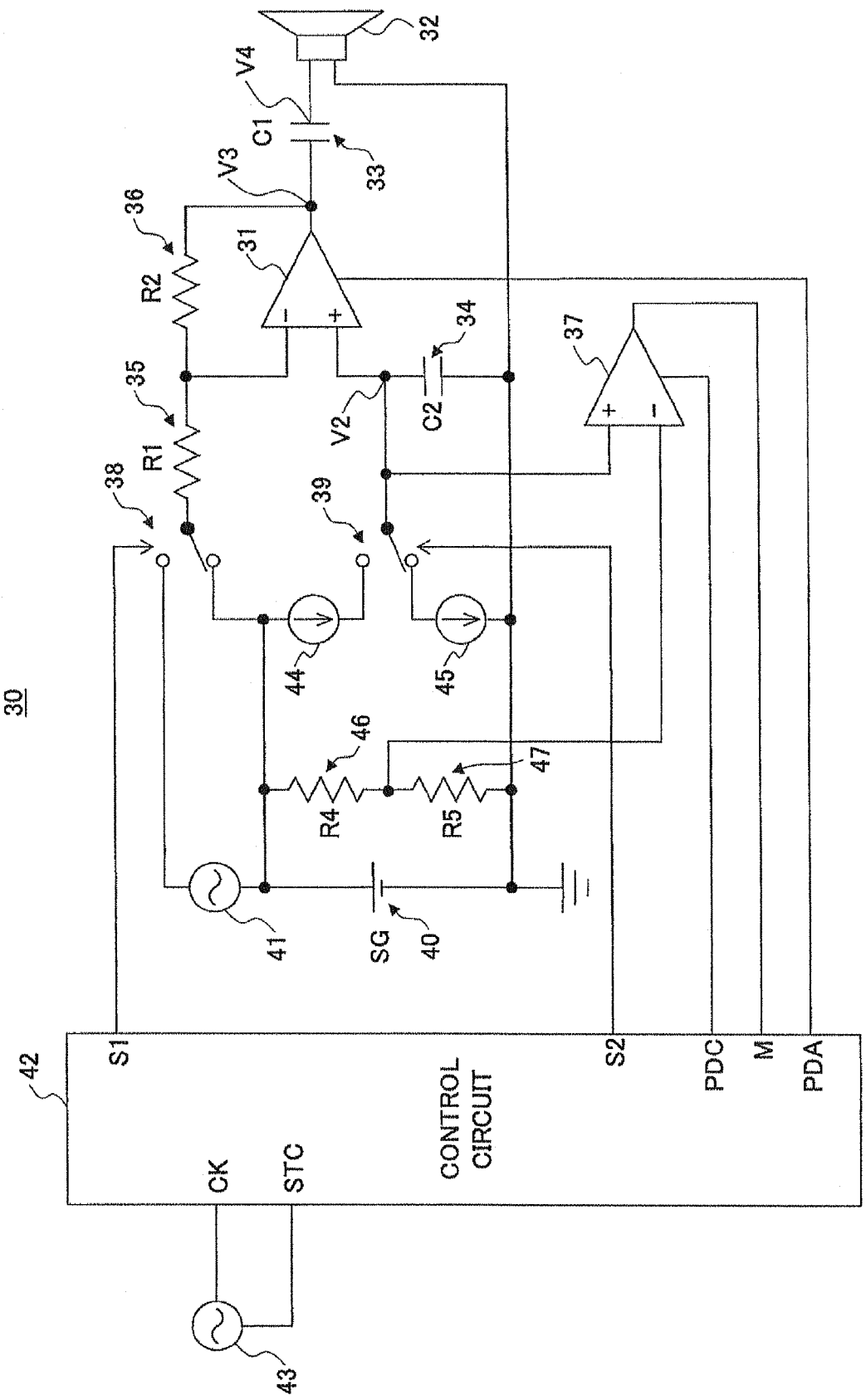
FIG. 3 is a drawing showing an example of the configuration of a pop-sound suppressing circuit to which the voltage control circuit of the present invention is applied.

FIG. 3 is a drawing showing an example of the configuration of a pop-sound suppressing circuit to which the voltage control circuit of the present invention is applied. A pop-sound suppressing circuit 30 shown in FIG. 3 includes an amplifier 31, a speaker 32, a condenser 33 having capacitance C1, a condenser 34 having capacitance C2, a resistor 35 having resistance R1, a resistor 36 having resistance R2, a comparator 37, a switch 38, a switch 39, a constant voltage source 40 for providing a signal ground SG, an audio signal source 41, a control circuit 42, an oscillating circuit 43, a constant current source 44, a constant current source 45, a resistor 46 having resistance R4, and a resistor 47 having resistance R5.

Figure 4:
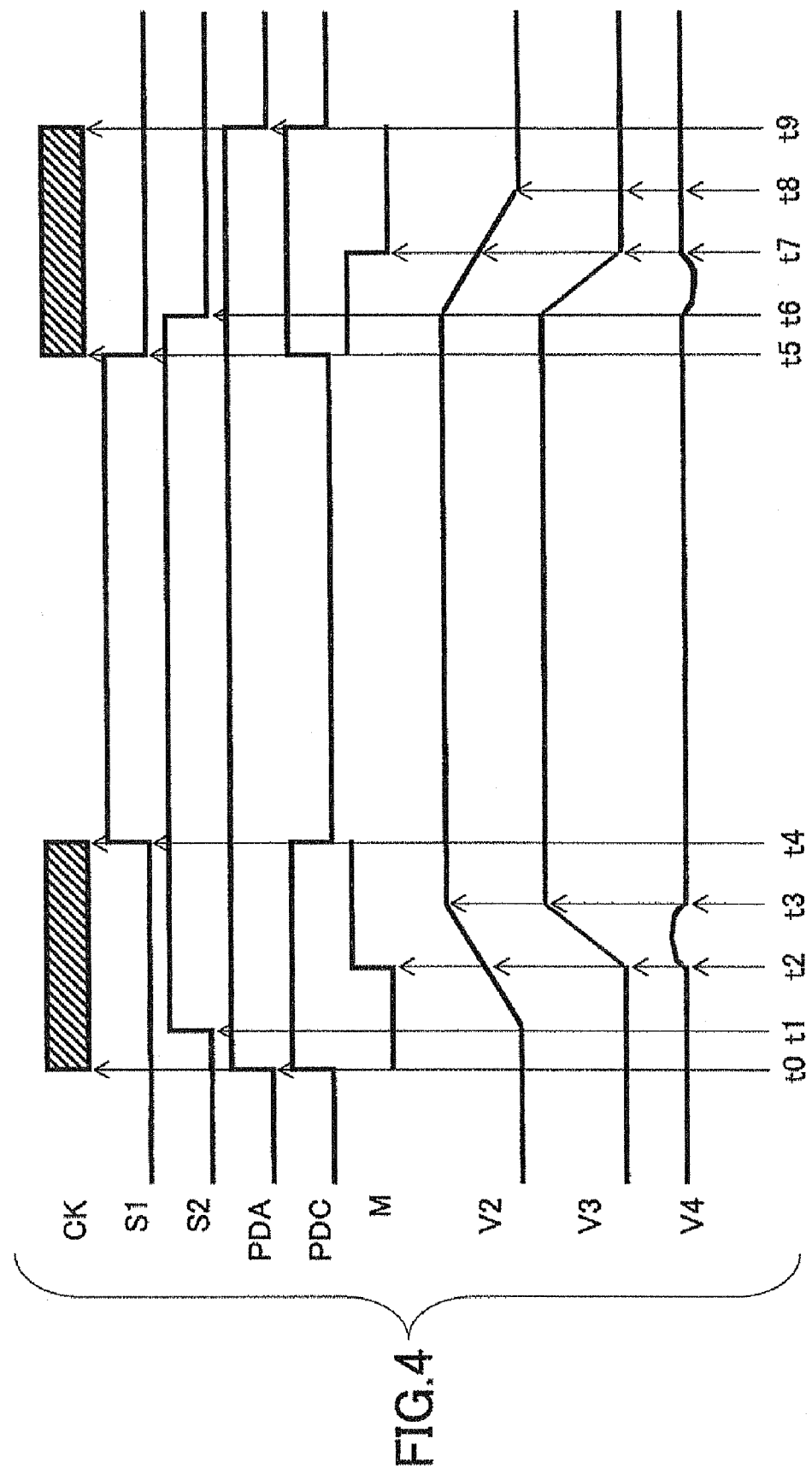
FIG. 4 is a drawing showing signal waveforms illustrating the operation of the pop-sound suppressing circuit shown in FIG. 3.

FIG. 4 is a drawing showing signal waveforms illustrating the operation of the pop-sound suppressing circuit 30 shown in FIG. 3. The signals having waveforms illustrated in FIG. 4 are identified in FIG. 3 by their signal names to indicate which signals in the circuit of FIG. 3 correspond to the signals shown in FIG. 4. In the following, a description will be given of the operation of the pop-sound suppressing circuit 30 of FIG. 3 by referring to FIG. 4.

A clock signal CK supplied from the oscillating circuit 43 to the control circuit 42 is active during the periods shown by hatching in FIG. 4, i.e., is alternating between HIGH and LOW (although not so illustrated in FIG. 4). Since the alternating changes of the clock signal CK are too small to be illustrated according to the scale of FIG. 4, the hatching pattern shown in the row for the clock signal CK is intended to indicate such an active state.

The control circuit 42 enables an activation signal PDA of the amplifier 31 at timing t0. In the example shown in FIG. 4, the activation signal PDA is HIGH in the enabled state, so that the amplifier 31 operates during the period in which the activation signal PDA is HIGH. The control circuit 42 also enables an activation signal PDC of the comparator 37 at timing t0. In the example shown in FIG. 4, the activation signal PDC is HIGH in the enabled state, so that the comparator 37 operates during the period in which the activation signal PDC is HIGH. The control circuit 42 also enables an activation signal STC (see FIG. 3) of the oscillating circuit 43 at timing t0. The clock signal CK is generated (placed in the active state) as shown in FIG. 4 during the periods in which the activation signal STC is enabled.

At this timing, a switch control signal S1 generated by the control circuit 42 is LOW, so that the switch 38 is connected to the constant voltage source 40 (i.e., placed in the switching state as illustrated in FIG. 3). At this timing, also, a switch control signal S2 generated by the control circuit 42 is LOW, so that the switch 39 is connected to the ground through the constant current source 45 (i.e., placed in the switching state as illustrated in FIG. 3).

At timing t0, thus, a voltage signal V2 is zero. No electric charge is stored in the condenser 34, so that the non-inverted input (+) of the amplifier 31 is set to the ground potential. The inverted input (−) of the amplifier 31 is set to the signal ground SG that is a reference potential for audio signals. Further, a voltage signal V3 output from the amplifier 31 and a voltage signal V4 input into the speaker 32 are both set to the ground potential. In general, the signal ground potential SG is approximately ½ of the power supply voltage.

At next timing t1, the control circuit 42 changes the control signal S2 for the switch 39 to HIGH, thereby connecting the switch 39 to the potential SG of the constant voltage source 40 (through the constant current source 44). As a result, the voltage signal V2 is set to SG to start charging the condenser 34, resulting in a gradual increase in the voltage signal V2. In the end, the voltage signal V2 reaches the voltage SG at timing t3.

With resistance R1 of the resistor 35 equal to resistance R2 of the resistor 36, the amplification factor is 2 with respect to the non-inverted input of the amplifier 31. Accordingly, the output V3 of the amplifier 31 is equal to the ground potential until the non-inverted input V2 reaches ½ of SG at timing t2, and then gradually increases after t2. In the end, the output V3 reaches the voltage SG at timing t3 in the same manner as V2.

The input terminal of the speaker 32 receives a flow of an electric current for charging the condenser 33 while the amplifier output voltage V3 is increasing. As a result, the voltage V4 at the input terminal of the speaker 32 increases. This potential increase is genteel as shown in FIG. 4, so that the sound generated by the speaker 32 is outside the audible frequency band, and is not perceived as an unpleasant noise.

With the current amount of the constant current source 44 being denoted as Ic, the non-inverted input V2 of the amplifier 31 is expressed as follows:

$$V2 = Ic \times t / C2.$$

The non-inverted input V2 thus linearly increases with time until it reaches t3.

With resistance R4 of the resistor 46 equal to resistance R5 of the resistor 47, a reference voltage that is a negative input of the comparator 37 is ½ of SG. Accordingly, an output M of the comparator 37 changes from the LOW level to the HIGH level at timing t2 at which the voltage V2 at the positive input of the comparator 37 becomes ½ of SG. In response to this change of the output M, the control circuit 42 stores in an internal register a value responsive to a count of an internal counter. With this arrangement, the value responsive to the count observed at the timing of the change of the output M is stored in the register. The counter starts counting at timing t1, and counts the number of pulses of the clock signal CK generated by the oscillating circuit 43. The configuration of the control circuit 42 will be described later.

With an ideal constant current source 44 that generates a constant current until the potential V2 becomes SG, the charging of the condenser 34 should be completed, with V2 equal to SG, at timing t3 at which the count becomes twice the recorded count observed at the time of the change of the output M. When a transistor such as that of a current mirror circuit is used as a constant current source, the drain current decreases as the drain-to-source voltage decreases. Because of this, V2 may not reach SG at timing t3. To allow a margin for error, charging is assumed to be completed at timing t4 at which the count becomes three times the recorded count observed at the time of the change of the output M, for example, and the control circuit 42 changes the switch control signal S1 to HIGH at timing t4. This results in the switch 38 being connected to the audio signal source 41, so that the audio signals are supplied to the inverted input of the amplifier 31. The speaker 32 thus generates sounds responsive to the audio signals. At this timing t4, also, the control circuit 22 stops the operation of the comparator 37 and the oscillating circuit 43. This serves to reduce current consumption.

In this manner, the condenser coupled to the input node of the amplifier (i.e., target circuit to be controlled) is charged by a constant current source. A first time period passing from the start of the charging to the timing at which the voltage across the condenser reaches a predetermined voltage is measured. The input conditions of the amplifier (i.e., target circuit) are changed upon the passage of a second time period from the start of the charging where the second time period is responsive to the first time period. Namely, the first time period from start timing t1 to timing t2 is measured, and the inverted input of the amplifier 31 is changed by the switch 38 upon the passage of the second time period (t4−t1=3×(t2−t1)) from the start timing t1 where the second time period is responsive to the first time period.

At the time of switching off the circuit, the control circuit 42 changes the control signal S1 to LOW at timing t5, thereby changing the connection of the switch 38 from connection to the audio signal source 41 to connection to the signal ground SG of the constant voltage source 40. The control circuit 42 also enables the activation signal PDC of the comparator 37 at timing t5. In the example shown in FIG. 4, the activation signal PDC is HIGH in the enabled state, so that the comparator 37 operates during the period in which the activation signal PDC is HIGH. The control circuit 42 also enables the activation signal STC (see FIG. 3) of the oscillating circuit 43 at timing t5. The clock signal CK is generated (placed in the active state) as shown in FIG. 4 during the periods in which the activation signal STC is enabled.

At next timing t6, the control circuit 42 changes the control signal S2 to LOW, thereby changing the connection of the switch 39 from connection to the signal ground SG (through the constant current source 44) to connection to the ground (through the constant current source 45). With the current amount of the constant current source 45 being denoted as Ic, the non-inverted input V2 of the amplifier 31 is expressed as follows:

$$V2 = SG - Ic \times t / C2.$$

The non-inverted input V2 thus linearly decreases with time until it reaches t8. At timing t8, the potential V2 reaches the ground potential.

The input terminal of the speaker 32 provides a flow of an electric current for discharging the condenser 33, which is opposite to what happened at the time of power-on. As a result, the voltage V4 at the input terminal of the speaker 32 drops. This potential drop is genteel as shown in FIG. 4, so that the sound generated by the speaker 32 is outside the audible frequency band, and is not perceived as an unpleasant noise.

In this example, resistance R4 of the resistor 46 is equal to resistance R5 of the resistor 47, so that the reference voltage that is a negative input of the comparator 37 is ½ of SG. Accordingly, the output M of the comparator 37 changes from the HIGH level to the LOW level at timing t7 at which the voltage V2 at the positive input of the comparator 37 becomes ½ of SG. In response to this change of the output M, the control circuit 42 stores in the internal register a value responsive to a count of the internal counter. With this arrangement, the value responsive to the count observed at the timing of the change of the output M is stored in the register. The counter starts counting at timing t6, and counts the number of pulses of the clock signal CK generated by the oscillating circuit 43.

With an ideal constant current source 45 that generates a constant current until the potential V2 becomes the ground potential, the discharging of the condenser 34 should be completed, with V2 equal to 0, at timing t8 at which the count becomes twice the recorded count observed at the time of the change of the output M. When a transistor such as that of a current mirror circuit is used as a constant current source, the drain current decreases as the drain-to-source voltage decreases. Because of this, V2 may not reach the ground potential at timing t8. To allow a margin for error, discharging is assumed to be completed at timing t9 at which the count becomes three times the recorded count observed at the time of the change of the output M, for example, and the control circuit 42 disables the activation signal PDA at timing t9 to stop the operation of the amplifier 31. At this timing t9, also, the control circuit 22 stops the operation of the comparator 37 and the oscillating circuit 43.

In this manner, the condenser coupled to the input node of the amplifier (i.e., target circuit to be controlled) is discharged by a constant current source. A first time period passing from the start of the discharging to the timing at which the voltage across the condenser reaches a predetermined voltage is measured. The operation conditions of the amplifier (i.e., target circuit) are changed upon the passage of a second time period from the start of the charging where the second time period is responsive to the first time period. Namely, the first time period from start timing t6 to timing t7 is measured, and the operation of the amplifier 31 is stopped by disabling the activation signal PDA upon the passage of the second time period (t9−t6=3×(t7−t6)) from the start timing t6 where the second time period is responsive to the first time period.

Figure 1:
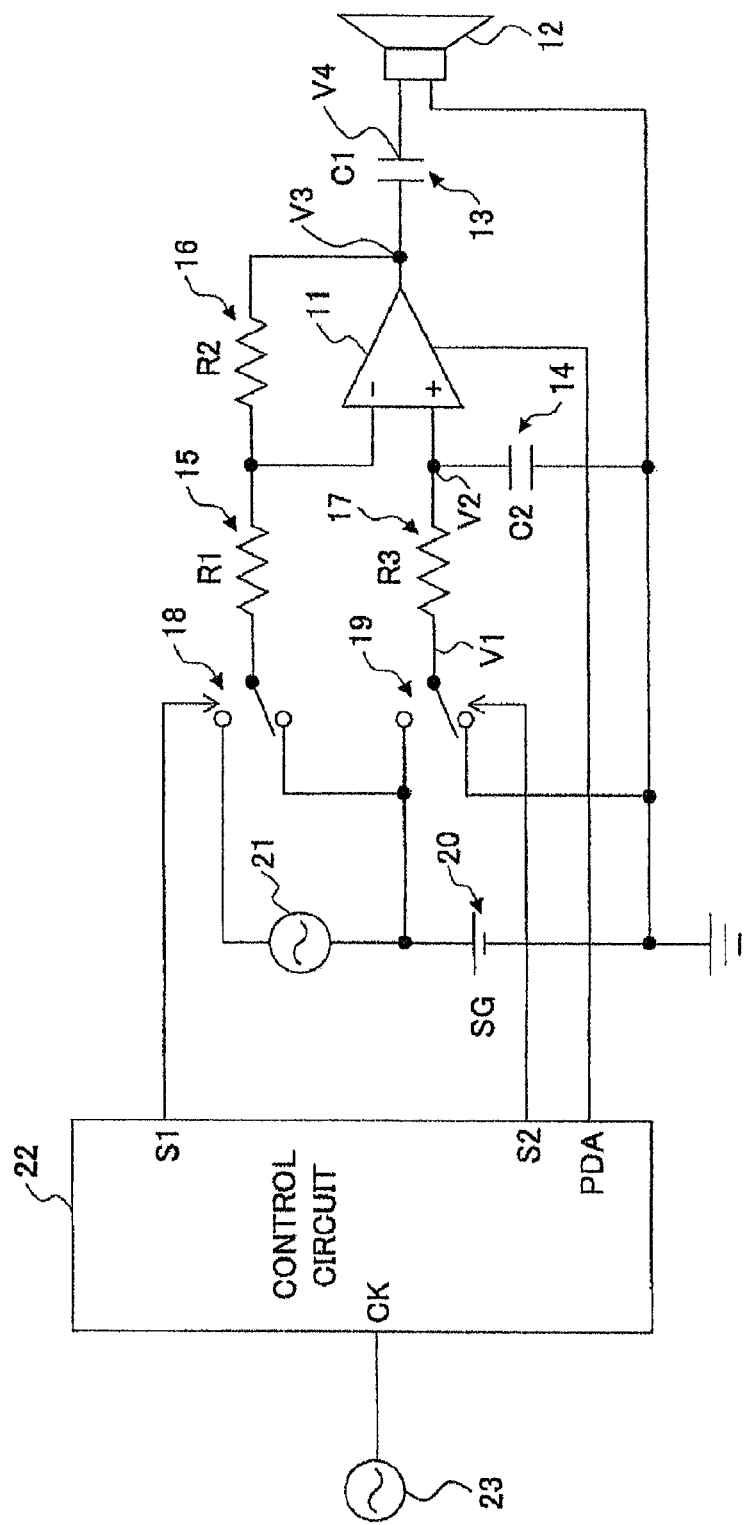
FIG. 1 is a drawing showing an example of the configuration of a related-art pop-sound suppressing circuit utilizing the charging/discharging of a condenser.
Figure 2:
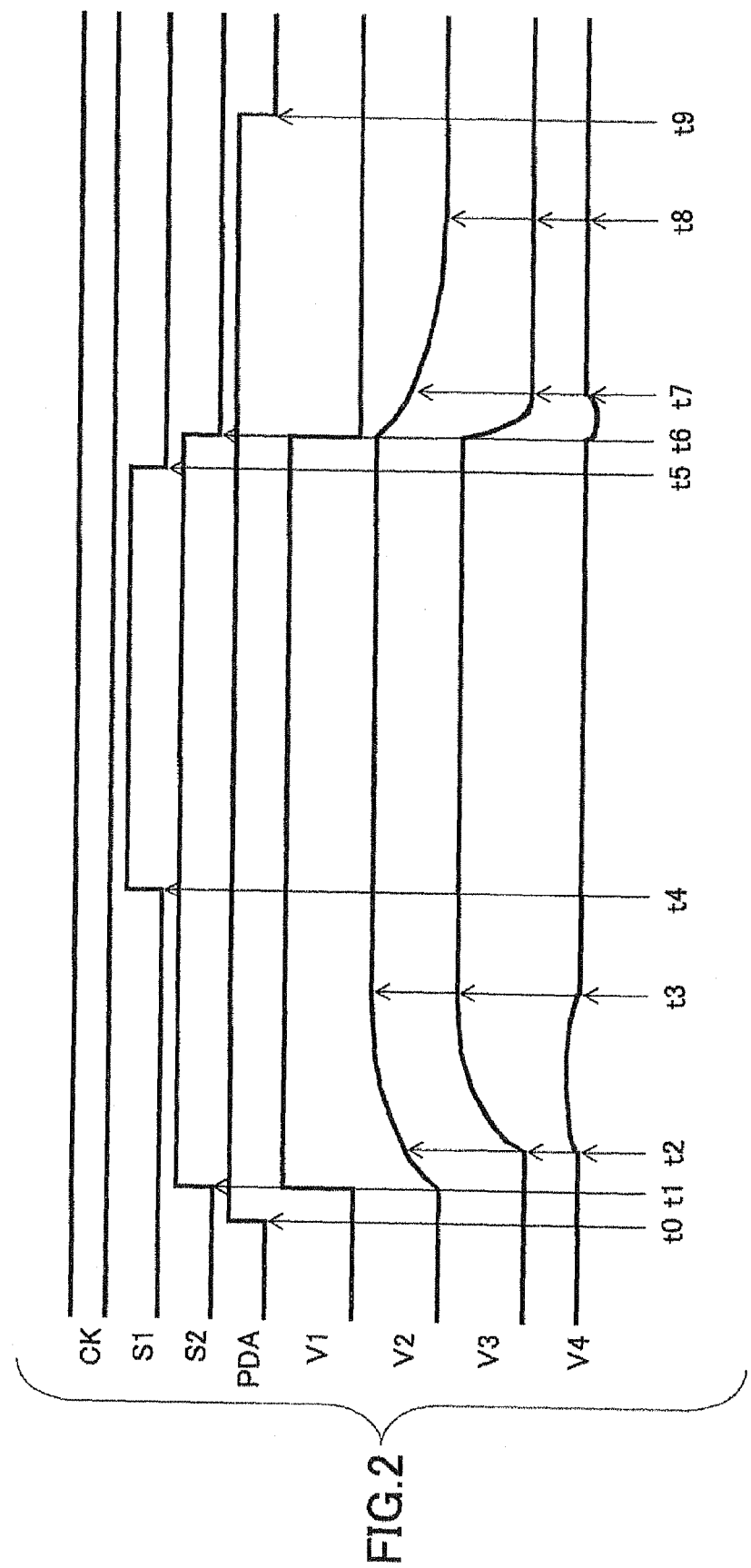
FIG. 2 is a drawing showing signal waveforms illustrating the operation of the pop-sound suppressing circuit shown in FIG. 1.

In the related-art configuration, the voltage across the condenser at the time of electric charge or discharge is expressed by an exponential curve, so that the following relation is observed as shown in FIG. 2.

$$t2-t1 < t3-t2, \quad t7-t6 < t8-t7$$

In the present embodiment, on the other hand, the voltage across the condenser at the time of electric charge or discharge is expressed by a straight line, so that the following relation is observed as shown in FIG. 4.

$$t2-t1 = t3-t2, \quad t7-t6 = t8-t7$$

As an example, settings may be made such that t2−t1=t3−t2=t4−t3 and t7−t6=t8−t7=t9−t8, and that the amplifier activation time and the amplifier deactivation time are each set to 100 ms, which is the same as that of the related-art example shown in FIG. 2. In such case, the operation time periods are obtained as follows:

Amplifier Activation Time T3−T2=100 ms;
Amplifier Deactivation Time T7−T6=100 ms;
Activation Control Time T4−T1=300 ms; and
Deactivation Control Time T9−T6=300 ms.

As can be understood from these figures, a ratio of the actually required amplifier activation time and deactivation time to the entirety of the activation and deactivation control time is reduced compared to the related-art example. Consequently, the advantage is obtained that the activation and deactivation of the apparatus become fast, and also that power consumption decreases.

Figure 5:
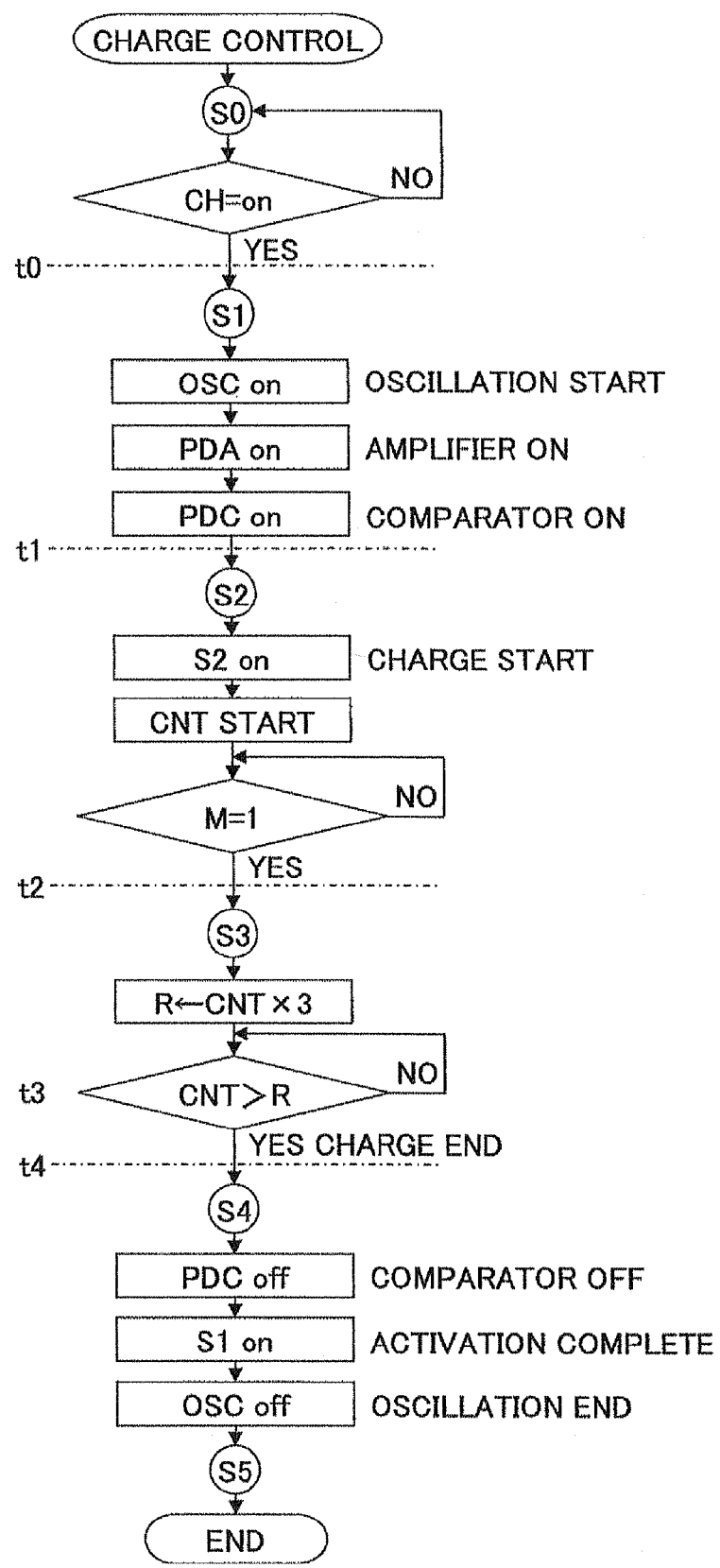
FIG. 5 is a drawing showing the procedure of charge control processing according to the present invention.

FIG. 5 is a drawing showing the procedure of charge control processing according to the present invention. The operation from the start of charge control to timing t0 (see FIG. 4) is shown as state S0 (which is a state of the control circuit 42 that is a state machine). In state S0, a check is made as to whether an activation start indicating signal CH is ON. If the check result is NO, the control procedure stays in state S0. If the check result is YES, the control procedure moves to next state S0.

The operations from timing t0 to timing t1 (see FIG. 4) are shown collectively as state S1. In this state S1, the oscillating circuit (OSC) 43 starts operating, and the activation signal PDA for the amplifier 31 and the activation signal PDC for the comparator 37 are enabled.

The operations from timing t1 to timing t2 (see FIG. 4) are shown collectively as state S2. In this state S2, the switch control signal S2 is changed to HIGH to start charging, and the counting operation of the counter of the control circuit 22 is started, followed by checking whether the output M of the comparator 37 is set to 1 (HIGH). If the check result is NO, the check is repeated. If the check result is YES, the control procedure moves to next state S3.

The operations from timing t2 to timing t4 (see FIG. 4) are shown collectively as state S3. In this state S3, a value that is three times the count value CNT of the counter is stored in the register. Further, a check is made as to whether the count value CNT becomes larger than the register stored value R. If the check result is NO, the check is repeated. If the check result is YES, the control procedure moves to next state S4.

The operations from timing t4 to the end (state S5) are shown collectively as state S4. In this state S4, the activation signal PDC for the comparator 37 is disabled, and the switch control signal S1 is set to HIGH to set the amplifier in a normal operation state that should come into effect after the activation process. Further, the oscillating circuit (OSC) 43 is deactivated. With this, the charge control comes to an end.

Figure 6:
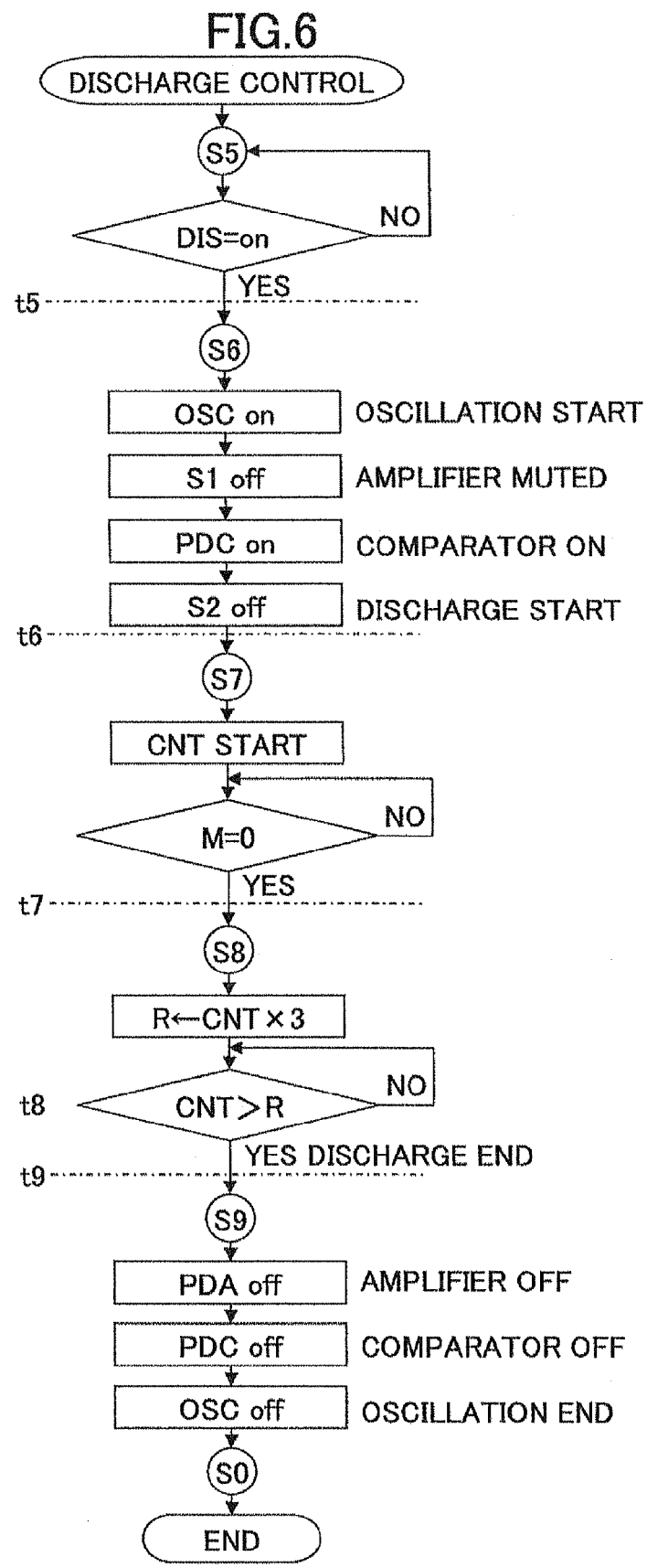
FIG. 6 is a drawing showing the procedure of discharge control processing according to the present invention.

FIG. 6 is a drawing showing the procedure of discharge control processing according to the present invention. The operation from the start of discharge operation to timing t5 (see FIG. 4) is shown as state S5. In state S5, a check is made as to whether a deactivation indicating signal DIS is ON. If the check result is NO, the control procedure stays in state S5. If the check result is YES, the control procedure moves to next state S6.

The operations from timing t5 to timing t6 (see FIG. 6) are shown collectively as state S6. In this state S6, the oscillating circuit (OSC) 43 is activated, and the switch control signal S1 is set to LOW to disconnect the amplifier from the signal source for use in the normal operation state. Further, the activation signal PDC for the comparator 37 is enabled, and the switch control signal S2 is set to LOW to start discharge.

The operations from timing t6 to timing t7 (see FIG. 4) are shown collectively as state S7. In this state S7, the counting operation of the counter of the control circuit 22 is started, followed by checking whether the output M of the comparator 37 is set to 0 (LOW). If the check result is NO, the check is repeated. If the check result is YES, the control procedure moves to next state S8.

The operations from timing t7 to timing t9 (see FIG. 4) are shown collectively as state S8. In this state S8, a value that is three times the count value CNT of the counter is stored in the register. Further, a check is made as to whether the count value CNT becomes larger than the register stored value R. If the check result is NO, the check is repeated. If the check result is YES, the control procedure moves to next state S9.

The operations from timing t9 to the end (state S0) are shown collectively as state S9. In this state S9, the activation signal PDA for the amplifier 31 and the activation signal PDC for the comparator 37 are disabled, and the oscillating circuit (OSC) 43 is deactivated. With this, the discharge control comes to an end.

Figure 7:
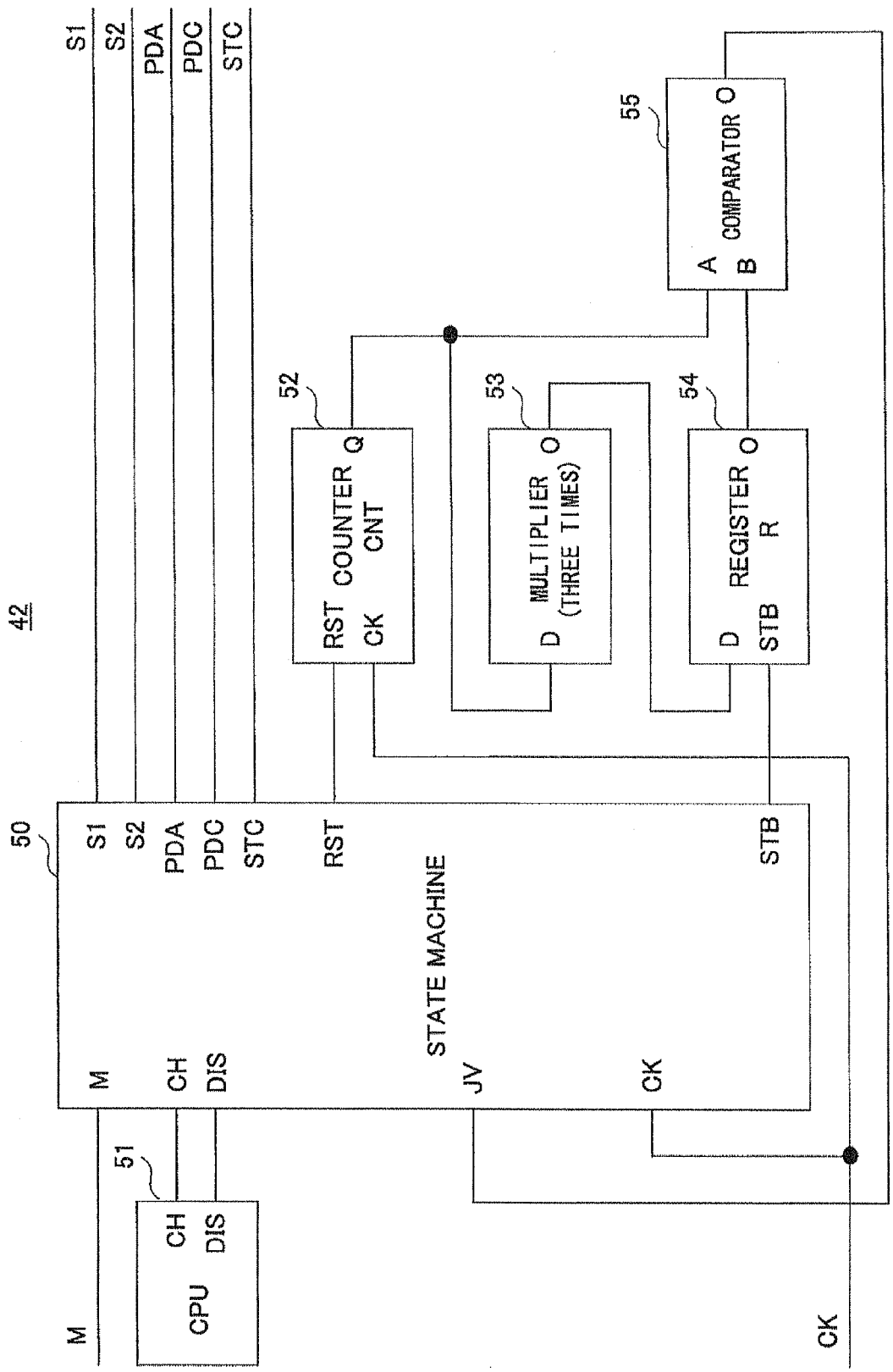
FIG. 7 is a drawing showing an example of the configuration of a control circuit.

FIG. 7 is a drawing showing an example of the configuration of the control circuit 42. The control circuit 42 of FIG. 7 includes a state machine 50, a CPU 51, a counter 52, a multiplier 53, a register 54, and a comparator 55. The state machine 50 receives the activation start indicating signal CH and the deactivation indicating signal DIS from the CPU 51. The state machine 50 generates various control signals such as the switch control signals S1 and S2, the amplifier activation signal PDA, the comparator activation signal PDC, and the oscillating circuit activation signal STC.

The state machine 50 resets the counter 52 by using a reset signal RST to make it start the counting operation at timing t1 and timing t6 shown in FIG. 4. The counter 52 counts the pulses of the clock signal CK. A count value Q of the counter 52 is supplied as data D to the multiplier 53. The multiplier 53 produces an output 0 made by multiplying the input count value by three for provision to the register 54. The state machine 50 receives the output M of the comparator 37 as an input M, and responds to a change in the input M by producing a store signal STB causing the register 54 to store the output of the multiplier 53 at timing t2 and timing t7 shown in FIG. 4.

The comparator 55 receives the output count value Q of the counter 52 as an input A, and also receives the value R stored in the register 54 as an input B. The comparator 55 compares the count value Q with the register stored value R and asserts the output O in response to the count value Q exceeding the register stored value R. The output of the comparator 55 is supplied to the state machine 50 as a JV input. In response to the assertion of the JV input, the state machine 50 changes the input conditions or operation conditions of the amplifier 31.

With the arrangement as described above, the control circuit 42 controls the charge/discharge operations as shown in FIG. 5 and FIG. 6. This makes it possible for the pop-sound suppressing circuit 30 shown in FIG. 3 to perform the operations as shown in FIG. 4.

Figure 8:
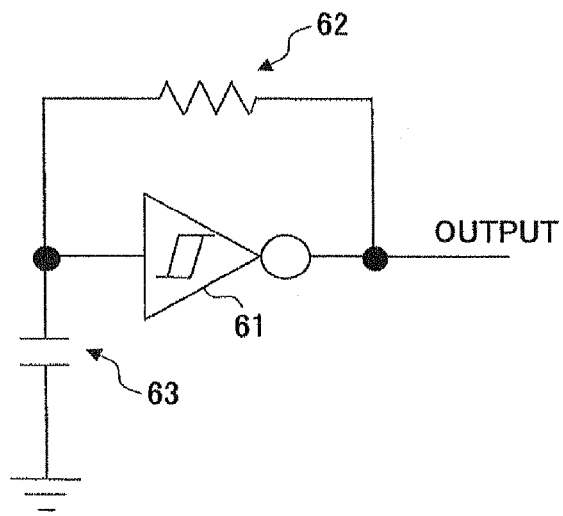
FIG. 8 is a drawing showing an example of the configuration of an oscillating circuit.

FIG. 8 is a drawing showing an example of the configuration of the oscillating circuit 43. The oscillating circuit 43 shown in FIG. 8 includes a Schmitt inverter 61, a resistor 62, and a condenser 63. The resistor 62 provides the output of the Schmitt inverter 61 as a feedback to the input thereof. The condenser 63 serves to delay a voltage change so as to provide an oscillating circuit. With this provision, the switching on/off of supply of the power supply voltage to the Schmitt inverter 61 makes it possible to control the activation/deactivation of the oscillating circuit 43.

Figure 9:
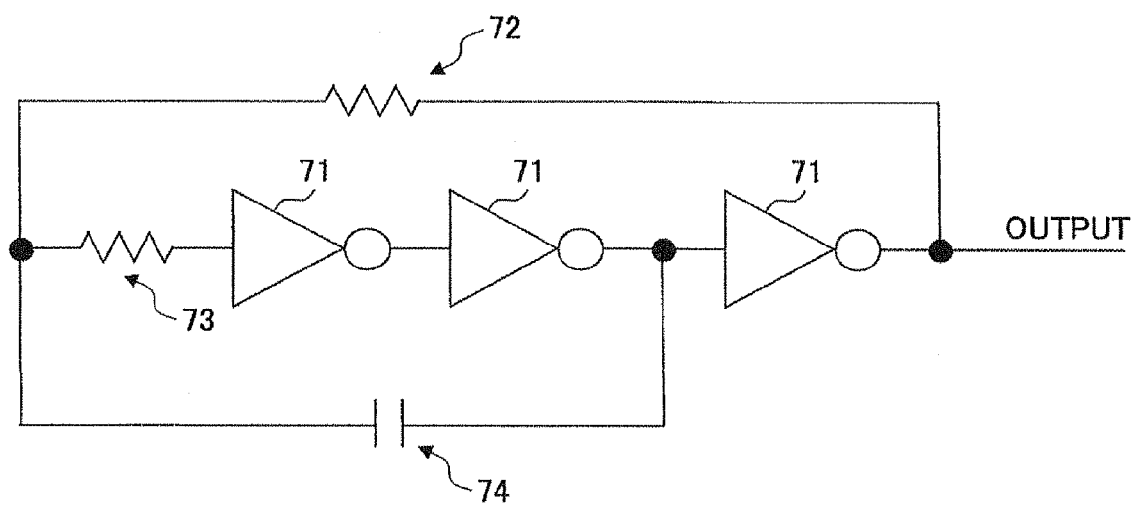
FIG. 9 is a drawing showing another example of the configuration of the oscillating circuit.

FIG. 9 is a drawing showing another example of the configuration of the oscillating circuit 43. The oscillating circuit 43 shown in FIG. 9 includes a plurality (odd number) of inverters 71, a resistor 72, a resistor 73, and a condenser 74. The output of an inverting-delay-device line comprised of the plurality (odd number) of inverters 71 is supplied through the resistors 72 and 73 to the input thereof as a feedback. The condenser 74 serves to delay a voltage change so as to provide an oscillating circuit. With this provision, the switching on/off of supply of the power supply voltage to the inverters 71 makes it possible to control the activation/deactivation of the oscillating circuit 43.

Figure 10:
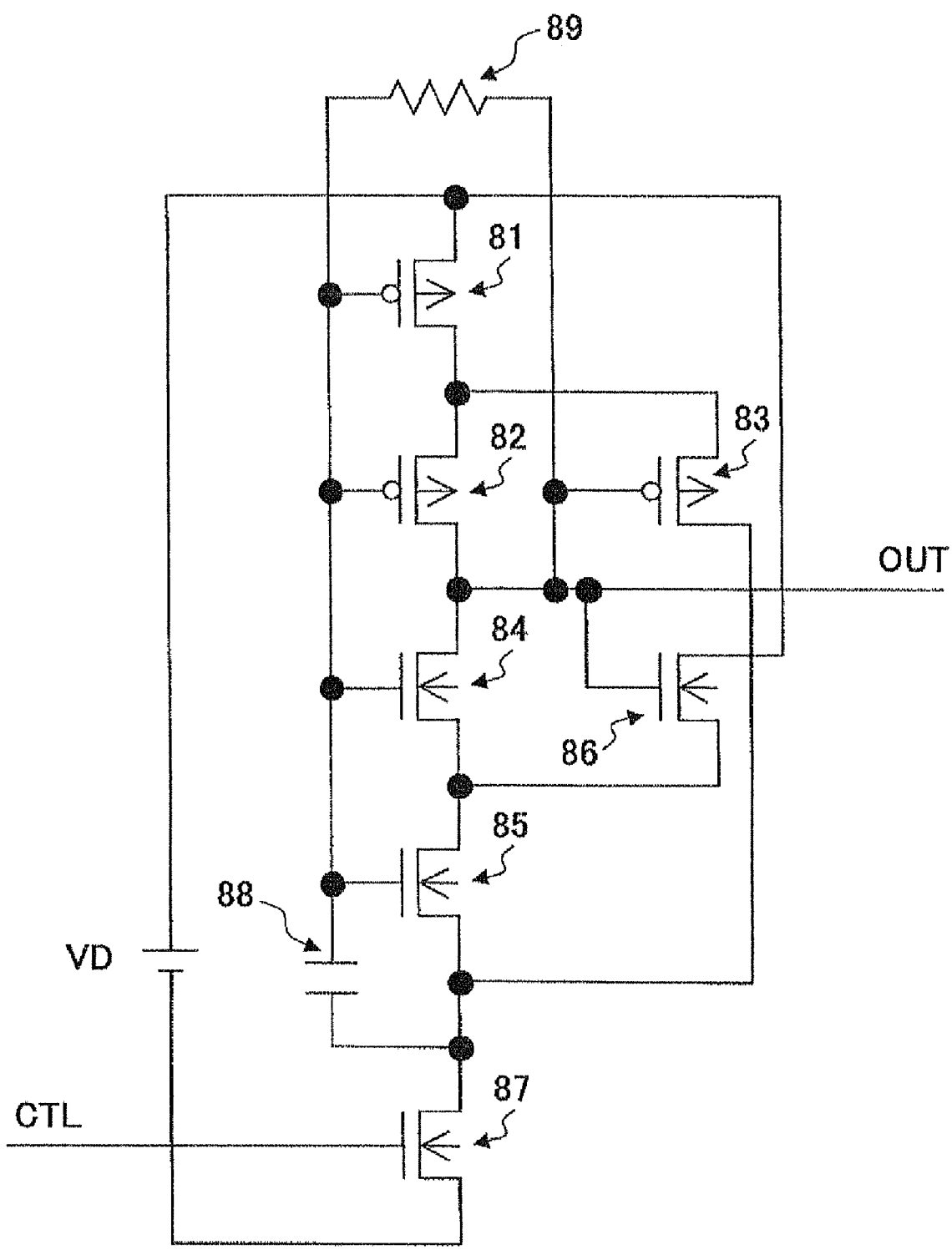
FIG. 10 is a drawing showing yet another example of the configuration of the oscillating circuit.

FIG. 10 is a drawing showing yet another example of the configuration of the oscillating circuit 43. The oscillating circuit 43 shown in FIG. 10 utilizes a Schmitt inverter having a control node, and includes PMOS transistors 81 through 83, NMOS transistors 84 through 87, a condenser 88, and a resistor 89.

The PMOS transistors 81 through 83 and the NMOS transistors 84 through 87 constitute a Schmitt inverter. Like the configuration shown in FIG. 8, the resistor 89 provides the output OUT of the Schmitt inverter as a feedback to the input thereof. The condenser 88 serves to delay a voltage change so as to provide an oscillating circuit. With this configuration, a control signal CTL is set to HIGH to make the NMOS transistor 87 conductive, thereby supplying a power supply voltage VD to the Schmitt inverter to perform an oscillating operation. Setting the control signal CTL to LOW makes the NMOS transistor 87 nonconductive, so that the power supply voltage VD is not supplied to the Schmitt inverter. No oscillation occurs in this case.

Figure 11:
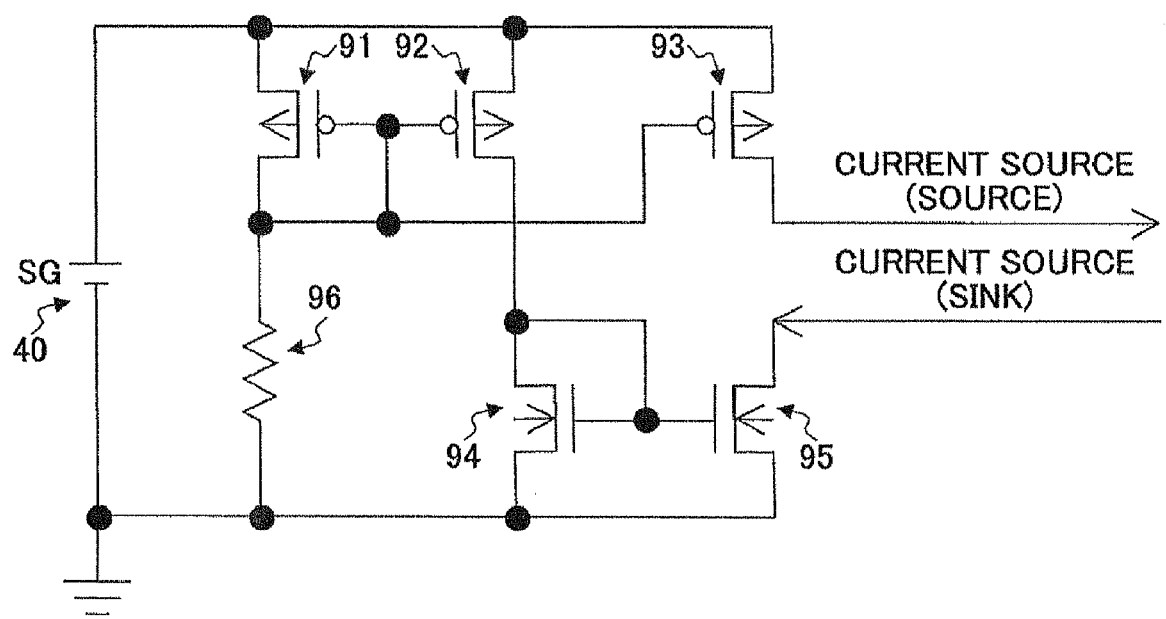
FIG. 11 is a drawing showing an example of the circuit configuration of a constant current source.

FIG. 11 is a drawing showing an example of the circuit configuration of the constant current source 44 and the constant current source 45. A constant current source shown in FIG. 11 includes PMOS transistors 91 through 93, NMOS transistors 94 and 95, and a resistor 96. The constant voltage source 40 serves to produce the signal ground voltage SG, and is shown in FIG. 3.

The PMOS transistor 91 and the resistor 96 are connected in series between the voltage SG generated by the constant voltage source 40 and the ground. The joint point between the PMOS transistor 91 and the resistor 96 is coupled to the gate of the PMOS transistor 91. Adjustment of the resistance of the resistor 96 makes it possible to achieve a desired current amount running through the PMOS transistor 91.

The gate of the PMOS transistor 91 is connected to the gates of the PMOS transistors 92 and 93. This connection provides a current mirror circuit, so that the drain currents running through the PMOS transistor 91, the PMOS transistor 92, and the PMOS transistor 93 are all identical. The drain current running through the PMOS transistor 93 is the current generated by the constant current source 44 (see FIG. 3).

The PMOS transistor 92 and the NMOS transistor 94 are connected in series between the voltage SG generated by the constant voltage source 40 and the ground. The joint point between the PMOS transistor 92 and the NMOS transistor 94 is coupled to the gate of the NMOS transistor 94. With this arrangement, the NMOS transistor 94 allows the passage of a drain current having the same amount as the drain current running through the PMOS transistor 91.

The gate of the NMOS transistor 94 is connected to the gate of the NMOS transistor 95. This connection provides a current mirror circuit, so that the drain current running through the NMOS transistor 95 becomes equal to the drain current running through the NMOS transistor 94. The drain current running through the NMOS transistor 95 is the current generated by the constant current source 45 (see FIG. 3).

Figure 12:
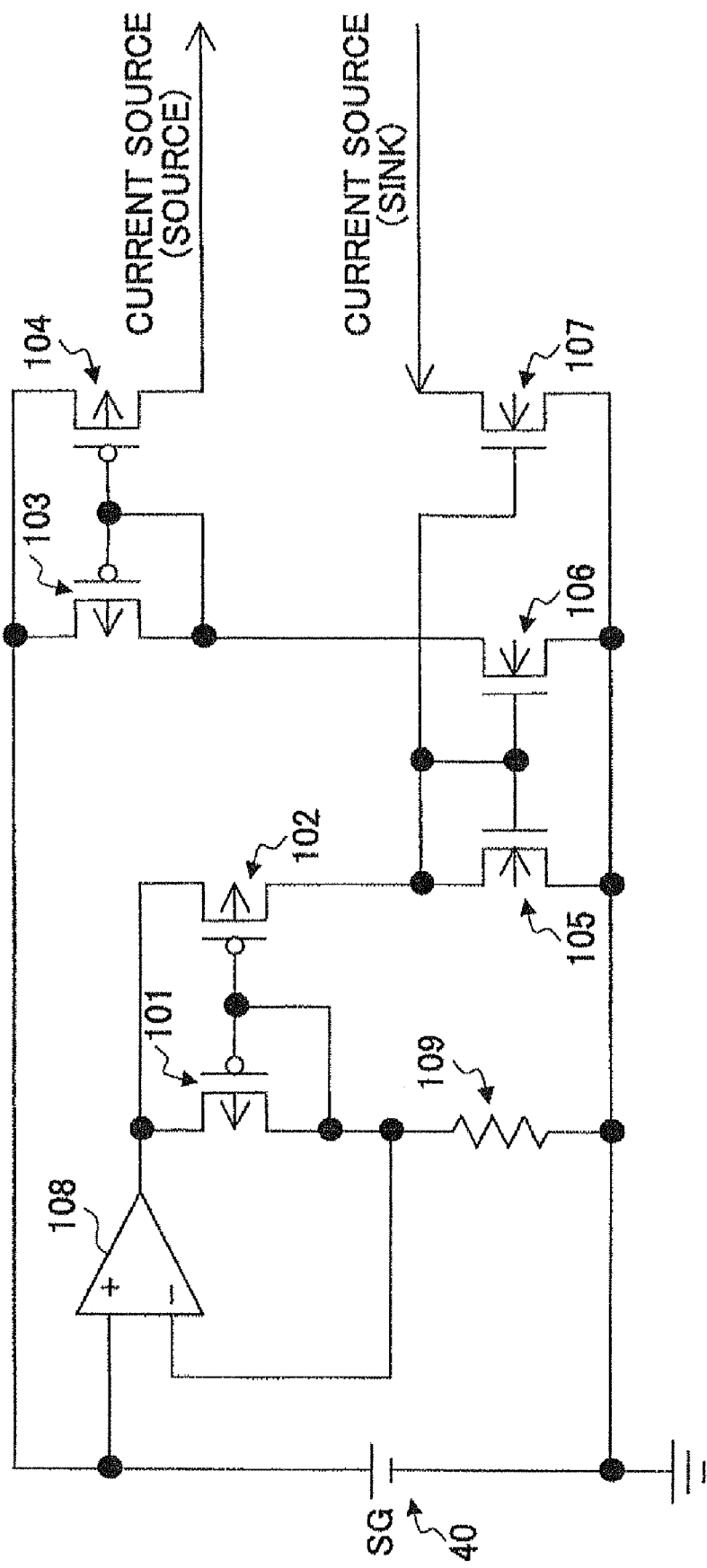
FIG. 12 is a drawing showing another example of the circuit configuration of the constant current source.

FIG. 12 is a drawing showing another example of the circuit configuration of the constant current source 44 and the constant current source 45. A constant current source shown in FIG. 12 includes PMOS transistors 101 through 104, NMOS transistors 105 through 107, an amplifier 108, and a resistor 109. The constant voltage source 40 serves to produce the signal ground voltage SG, and is shown in FIG. 3.

The voltage SG generated by the constant voltage source 40 is supplied to the non-inverted input of the amplifier 108. The PMOS transistor 101 and the resistor 109 are connected in series between the output of the amplifier and the ground. The joint point between the PMOS transistor 101 and the resistor 109 is coupled to the gate of the PMOS transistor 101 and also to the inverted input of the amplifier 108. This connection achieves a feedback control that serves to eliminate a difference between the inverted input and non-inverted input of the amplifier 108. Adjustment of the resistance of the resistor 109 makes it possible to achieve a desired current amount running through the PMOS transistor 101.

The gate of the PMOS transistor 101 is connected to the gate of the PMOS transistor 102. This connection provides a current mirror circuit, so that the drain current running through the PMOS transistor 102 becomes equal to the drain current running through the PMOS transistor 101.

The PMOS transistor 102 and the NMOS transistor 105 are connected in series between the output of the amplifier 108 and the ground. The joint point between the PMOS transistor 102 and the NMOS transistor 105 is coupled to the gate of the NMOS transistor 105. With this arrangement, the NMOS transistor 105 allows the passage of a drain current having the same amount as the drain current running through the PMOS transistor 101.

The gate of the NMOS transistor 105 is connected to the gates of the NMOS transistors 106 and 107. This connection provides a current mirror circuit, so that the drain currents running through the NMOS transistor 105, the NMOS transistor 106, and the NMOS transistor 107 are all identical. The drain current running through the NMOS transistor 107 is the current generated by the constant current source 45 (see FIG. 3).

The PMOS transistor 103 and the NMOS transistor 106 are connected in series between the voltage SG generated by the constant voltage source 40 and the ground. The joint point between the PMOS transistor 103 and the NMOS transistor 106 is coupled to the gate of the PMOS transistor 103. With this arrangement, the PMOS transistor 103 allows the passage of a drain current having the same amount as the drain current running through the PMOS transistor 101.

The gate of the PMOS transistor 103 is connected to the gate of the PMOS transistor 104. This connection provides a current mirror circuit, so that the drain current running through the PMOS transistor 104 becomes equal to the drain current running through the PMOS transistor 103. The drain current running through the PMOS transistor 104 is the current generated by the constant current source 44 (see FIG. 3).

In the configuration shown in FIG. 11, the voltage applied to the resistor 96 is the signal ground potential SG minus the source-to-gate voltage of the PMOS transistor 91 that is its threshold voltage, so that the voltage applied to the resistor 96 is affected by variation in the manufacturing process and temperature fluctuation. In the configuration shown in FIG. 12, on the other hand, the signal ground potential SG is applied to the resistor 109 through the feedback control of the amplifier 108. Accordingly, variation in the manufacturing process and temperature fluctuation have no effect.

Further, the present invention is not limited to these embodiments, but various variations and modifications may be made without departing from the scope of the present invention.

Although the above-described embodiments have been directed to an example in which the voltage control circuit of the present invention is applied to a pop-sound suppressing circuit, this is not a limiting example. The present invention may be used for the purpose of extending the life of a lamp by preventing a sudden current influx into the lamp and by gradually increasing the input current to the rated current, for example.

What is claimed is:

1. A circuit for controlling voltage, comprising:
a condenser having a first end coupled to an input node of a target circuit, and a second end coupled to a predetermined fixed potential;
a constant current source coupled to the first end of the condenser; and
a control circuit configured to charge or discharge the condenser by the constant current source, to measure a first time period passing from start timing of the charge or discharge to timing at which a voltage at the first end of the condenser reaches a predetermined voltage, and to change an input condition or operation condition of the target circuit upon passage of a second time period from the start timing where the second time period is responsive to the first time period.

2. The circuit for controlling voltage as claimed in claim 1, further comprising a switch, wherein the target circuit is an amplifier, and the switch is coupled to another input node of the amplifier that is different from said input node of the amplifier, and wherein the control circuit is configured to charge the condenser by the constant current source, and operates the switch upon the passage of the second time period from the start timing to switch nodes to which said another input node of the amplifier is connected.

3. The circuit for controlling voltage as claimed in claim 1, wherein the target circuit is an amplifier, and the control circuit is configured to discharge the condenser by the constant current source and to deactivate the amplifier upon the passage of the second time period from the start timing.

4. The circuit for controlling voltage as claimed in claim 1, further comprising a comparator configured to compare the predetermined voltage with the voltage at the first end to produce an output indicative of a result of the comparison, wherein the control circuit is configured to measure the first time period by measuring timing of a change in the output of the comparator based on a clock signal.

5. The circuit for controlling voltage as claimed in claim 4, wherein the control circuit includes:
a counter configured to start operating at the start timing to count pulses of the clock signal;
a register configured to store a value responsive to a count of the counter in response to the change in the output of the comparator; and
a circuit configured to detect an end timing of the second time period starting from the start timing in response to the value stored in the register and a count value of the counter.

6. The circuit for controlling voltage as claimed in claim 4, further comprising a clock signal oscillating circuit configured to generate the clock signal, wherein the control circuit is configured to stop the clock signal oscillating circuit upon the passage of the second time period from the start timing.

7. The circuit for controlling voltage claimed in claim 1 wherein the constant current source includes a current mirror circuit.

8. The circuit for controlling voltage as claimed in claim 7, wherein the current mirror circuit includes a transistor for discharging the condenser and a transistor for charging the condenser.

9. The circuit for controlling voltage as claimed in claim 1, wherein the constant current source includes:
- an amplifier having a first input node coupled to a predetermined power supply voltage;
- a first transistor having a first end of a channel thereof coupled to an output of the amplifier, a second end of a channel thereof coupled to a second input node of the amplifier, and a control end coupled to the second end of the channel;
- a resistor to couple between the second end of the channel and a ground voltage;
- a second transistor sharing an identical gate voltage and an identical source voltage with the first transistor; and
- a plurality of transistors each configured to produce a flow of a current having an amount identical to a current amount flowing through the second transistor.

* * * * *